(12) United States Patent
Grabner

(10) Patent No.: US 6,674,365 B2
(45) Date of Patent: Jan. 6, 2004

(54) COMMUNICATION TERMINAL

(75) Inventor: Wolfgang Grabner, Freilassing (DE)

(73) Assignee: Skidata AG, Gartenau (AT)

( * ) Notice: Subject to any disclaimer, the term of this patent is extended or adjusted under 35 U.S.C. 154(b) by 2 days.

(21) Appl. No.: 09/937,118

(22) PCT Filed: Jan. 18, 2001

(86) PCT No.: PCT/EP01/00559

§ 371 (c)(1),
(2), (4) Date: Dec. 18, 2001

(87) PCT Pub. No.: WO01/54049

PCT Pub. Date: Jul. 26, 2001

(65) Prior Publication Data

US 2003/0071732 A1 Apr. 17, 2003

(30) Foreign Application Priority Data

Jan. 20, 2000 (DE) .......................... 100 02 311

(51) Int. Cl.[7] .............................................. G08B 13/14
(52) U.S. Cl. ................................. 340/572.5; 340/572.1
(58) Field of Search ........................ 340/572.5, 572.1, 340/572.2, 572.3, 572.8, 10.1, 10.3

(56) References Cited

U.S. PATENT DOCUMENTS

| 5,293,137 A | * | 3/1994 | Tavis et al. ............... 331/49 |
|---|---|---|---|
| 5,450,492 A | * | 9/1995 | Hook et al. ................ 380/28 |
| 5,517,179 A | * | 5/1996 | Charlot, Jr. ............. 340/572.2 |
| 5,537,094 A | * | 7/1996 | Bettine et al. .......... 340/572.4 |
| 5,831,348 A | | 11/1998 | Nishizawa |
| 5,963,173 A | * | 10/1999 | Lian et al. ................. 343/742 |
| 6,310,581 B1 | | 10/2001 | Stockhammer |
| 6,362,738 B1 | * | 3/2002 | Vega ....................... 340/572.1 |
| 6,400,271 B1 | * | 6/2002 | Davies et al. ........... 340/572.1 |

FOREIGN PATENT DOCUMENTS

| CA | 2 019 921 A | 1/1991 |
|---|---|---|
| DE | 392 29 77 | 1/1991 |
| DE | 196 51 719 | 12/1997 |
| DE | 198 31 767 | 1/2000 |
| WO | WO 94/03982 | 2/1994 |

* cited by examiner

Primary Examiner—John Tweel
(74) Attorney, Agent, or Firm—Flynn, Thiel, Boutell & Tanis, P.C.

(57) ABSTRACT

A terminal designed for communication with contactless-type data carriers with two different carrier frequencies has two resonant circuits (I, II) for one and the other carrier frequency. Both resonant circuits (I, II) work with one and the same antenna (A) and one capacitor (C1, C3) in each case. In the resonant circuit (II) for low carrier frequency a coupling inductance coil (L) is provided between the capacitor (C3) and the antenna (A).

18 Claims, 1 Drawing Sheet

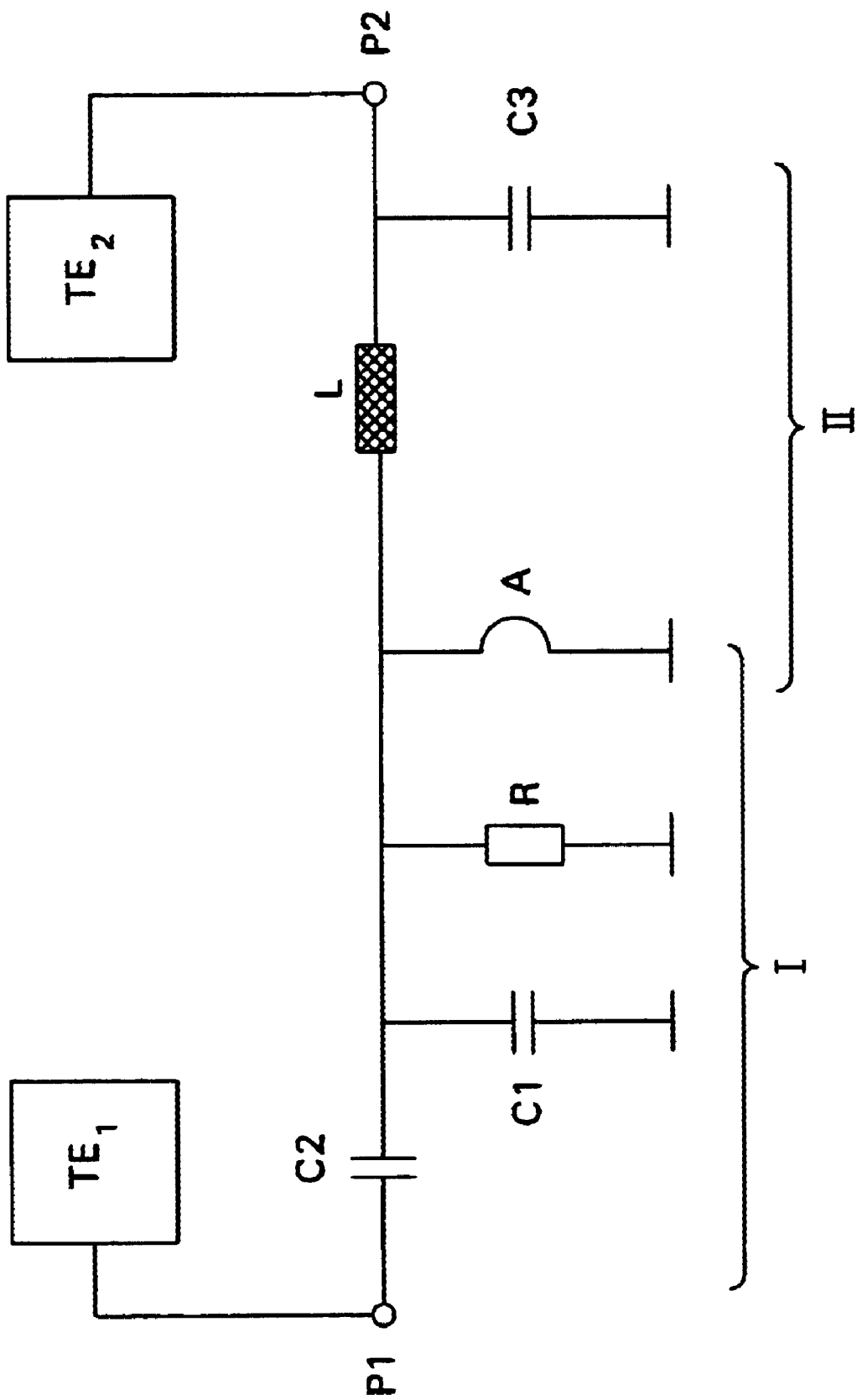

COMMUNICATION TERMINAL

FIELD OF THE INVENTION

This invention relates to a terminal for data communication with contactless-type data carriers, having transceiver electronics with two resonant circuits with an antenna and capacitor for radiating electromagnetic waves with different carrier frequencies.

BACKGROUND OF THE INVENTION

The data carriers are formed as transponders. After activation by the terminal's electromagnetic field, data stored in the data carrier can be read out and changed if necessary.

Contactless-type data carriers, for example contactless-type smart cards, are used for a great variety of applications, for example for the use of public transport systems, as electronic purses, health insurance ID cards and the like. Since the number of smart cards that a person carries is in general increasing constantly, it is desirable to have a multifunctional data carrier that can be employed for as many applications as possible.

Higher-frequency transponders are superior to transponders with a lower carrier frequency, in particular with respect to the data transfer rate. On the other hand, high-frequency transponders typically require a large frequency bandwidth in order to have a high data transfer rate. It is therefore desirable to be able to use a high or low carrier frequency alternatively for communication between the terminal and the data carriers depending on the application.

While the choice of carrier frequency used to be largely unregulated, now the carrier frequency, allowable frequency bandwidth and transmitting energy radiated by the terminal are fixed by governing regulations. For example, a carrier frequency of 13.56 MHz is stipulated by the ISO standard.

On the other hand, there are still numerous data carriers that work with another, usually much lower, carrier frequency. For example, for access entitlement to ski lifts one uses data carriers with a carrier frequency of 120–125 kHz integrated into watches, clothes or the like. If communication between access terminal and data carrier shows access entitlement, the access terminal emits an enabling signal, for example to release a blocking apparatus like a turnstile.

To permit terminals to communicate with data carriers of different carrier frequencies, e.g. both with 13.56 MHz data carriers and with 125 kHz data carriers, a known prior art terminal has two resonant circuits, one resonant circuit with a small antenna for low carrier frequency and one resonant circuit with a large antenna for high carrier frequency, see German Patent Document No. DE 198 31 767/U.S. Pat. No. 6,310,581. This involves high additional expenditure and space problems. Moreover, the antennas can influence each other.

German Patent Document No. DE 196 51 719 A1/U.S. Pat. No. 5,813,348 discloses a wireless transceiver system for example for interrogating IC cards which has primary and secondary circuit devices and thus a terminal for communication with contactless-type data carriers. The secondary device includes two resonant circuits having different resonant frequencies. The electromagnetic oscillations to be emitted are radiated via the particular resonant circuit coil.

According to WO 94/03982 A1, two frequencies are used for identification. DE 39 22 977 C2 discloses a trimming circuit wherein electromagnetic oscillations of different frequency positions are radiated via a single antenna, the single resonant circuit being adjusted in its frequency position by connection or disconnection of individual capacitances.

SUMMARY OF THE INVENTION

The object of the invention is to substantially reduce the expenditure and the space required for a terminal capable of communicating contactlessly with data carriers over two different data transfer carrier frequencies.

According to the invention, one uses a single, common antenna for both resonant circuits, i.e. both for the high-frequency and for the low-frequency resonant circuit of the terminal. This considerably reduces the cost of providing the circuit and the space it occupies. It is further advantageous that there is no longer any mutual influencing of several antennas.

A coupling inductance coil is provided according to the invention in the resonant circuit for low carrier frequency between its capacitor and the antenna. The coil forms a high A.C. impedance for high carrier frequency but a small one for low carrier frequency. Consequently, only the resonant circuit for high carrier frequency communicates with data carriers designed for high carrier frequency.

The ratio of the A.C. impedance of the coil corresponds exactly to the carrier frequency ratio of the two resonant circuits ($X_L = 2\pi \cdot f \cdot L$). That is, the impedance of the coil is e.g. about 110 times greater at a high carrier frequency of 13.56 MHz compared to a low carrier frequency of 125 kHz. In general, the ratio of high carrier frequency to low carrier frequency should be at least 10, preferably at least 50.

In order to guarantee that only the resonant circuit for low carrier frequency communicates with data carriers designed for low carrier frequency, at least one capacitor is preferably provided between the transceiver electronics of the terminal and the resonant circuit for high carrier frequency. This capacitor forms, together with the capacitor in the resonant circuit for high carrier frequency, a high resistance for low carrier frequency but a low resistance for high carrier frequency. Consequently, only the resonant circuit for low carrier frequency communicates with data carriers designed for low carrier frequency.

At the same time, the capacitor (C2) between the transceiver electronics and the resonant circuit for high carrier frequency forms together with the resonant circuit capacitor (C1) an adapter circuit for the driver stage, thereby avoiding reflection and parasitic power radiation. The transceiver electronics of the terminal is connected with the antenna with a coax cable with a corresponding characteristic impedance.

Preferably, the resonant circuit for high carrier frequency has at least one shunt resistor in order to permit adjustment of the quality of said resonant circuit.

According to the invention, the two resonant circuits can be activated for communication alternatingly with a multiplexer for example. It is even also possible to activate both resonant circuits for communication simultaneously.

BRIEF DESCRIPTION OF THE DRAWING

In the following description, the invention will be explained in more detail by way of example with reference to FIG. 1 showing a basic schematic of the two resonant circuits.

DETAILED DESCRIPTION

As seen by FIG. 1, the invention includes a resonant circuit I of a terminal for the high carrier frequency of, for example 13.56 MHz. Resonant circuit I includes an antenna A and capacitor C1. The transceiver electronics $TE_1$ of the terminal are attached at P1, so as to connect with resonant circuit I by a capacitor C2. Furthermore, resonant circuit I has shunt resistor R for determining the quality of the resonant circuit.

Second resonant circuit II for the low carrier frequency of e.g. 125 kHz also includes antenna A and a separate capacitor C3. Antenna A is thus common to both resonant circuits I and II.

Resonant circuit II further includes inductance coil L between capacitor C3 and antenna A. The transceiver electronics $TE_2$ is attached to resonant circuit II at P2. The high and low carrier frequencies of for example 13.56 MHz and 125 kHz are fed to resonant circuits I and II by corresponding harmonic oscillators.

What is claimed is:

1. A terminal for connection to a contactless data carrier having first transceiver electronics that exchanges signals over a first frequency carrier signal and second transceiver electronics that exchanges signals over a second frequency carrier signal, the first and second carrier frequencies being different frequencies, said terminal including:
    a single antenna;
    a first resonant circuit for connection to the first transceiver electronics, said first resonant circuit comprising: said antenna; a first contact point for connecting said antenna to the first transceiver electronics; a first capacitor connected at one end to a junction between said antenna and said first contact point and at a second end to ground; and
    a second resonant circuit for connection to the second transceiver electronics, said second resonant circuit comprising: said antenna; an inductor in series between said antenna and said second transceiver electronics; and a second capacitor connected at one end to a junction between said inductor and said second transceiver electronics and, at a second end, to ground.

2. The terminal according to claim 1, further including a third capacitor located within said first resonant circuit, said third capacitor being series connected between, at one end of said third capacitor, to a junction of said antenna and said first capacitor and, at a second end of said third capacitor, the first contact point so that said first resonant circuit operates at a higher carrier frequency than the carrier frequency at which said second resonant circuit operates.

3. The terminal according to claim 2, wherein said first resonant circuit includes at least one shunt resistor connected at one end to a junction between said antenna and said first capacitor for adjusting the quality of said resonant circuit.

4. The terminal according to claim 2, wherein said resonant circuits are configured so that the ratio of the frequency of the carrier signal transferred between said first resonant circuit and the high frequency carrier signal transceiver electronics to the frequency of the carrier signal transferred between said second resonant circuit and the low frequency carrier signal transceiver electronics is at least 10:1.

5. The terminal according to claim 1, wherein said first resonant circuit includes at least one shunt resistor connected at one end to a junction between said antenna and said first capacitor for adjusting the quality of said resonant circuit.

6. The terminal according to claim 1, wherein said resonant circuits are configured so that the ratio of the frequency of the carrier signal transferred between said first resonant circuit and the high frequency carrier signal transceiver electronics to the frequency of the carrier signal transferred between said second resonant circuit and the low frequency carrier signal transceiver electronics is at least 10:1.

7. The terminal according to claim 1, wherein both said resonant circuits are activated for communication alternatingly.

8. The terminal according to claim 1, wherein both said resonant circuits are constructed to be activated for communication simultaneously.

9. A method of communicating with a contactless data carrier:
    communicating with the data carrier with first transceiver electronics that operates at a first carrier frequency;
    communicating with the data carrier with second transceiver electronics that operates at a second carrier frequency, the second carrier frequency being different from the first carrier frequency; and
    exchanging signals with the first transceiver electronics and the second transceiver electronics through a single terminal, the terminal comprising:
    a single antenna;
    a first resonant circuit connected to the first transceiver electronics, the first resonant circuit comprising: the antenna; an inductor in series between the antenna and the first transceiver electronics; and a first capacitor connected at one end to a junction between the inductor and the first transceiver electronics and, at a second end, to ground; and
    a second resonant circuit connected to the second transceiver electronics, the second resonant circuit comprising: the antenna; a connection between the antenna and the second transceiver electronics; and a second capacitor connected at one end to the connection between the antenna and the second transceiver electronics and, at a second end, to ground.

10. The method of claim 9, wherein, in said step of communicating with the data carrier with the second transceiver electronics, the second transceiver electronics operates so that the second carrier frequency is at least 10 times greater than the first carrier frequency.

11. The method of claim 10, wherein said step of communicating with the data carrier with the first transceiver electronics and said step of communicating with the data carrier with the second transceiver electronics are performed in an alternating sequence.

12. The method of claim 10, wherein said step of communicating with the data carrier with the first transceiver electronics and said step of communicating with the data carrier with the second transceiver electronics are performed simultaneously.

13. The method of claim 9, wherein said step of communicating with the data carrier with the first transceiver electronics and said step of communicating with the data carrier with the second transceiver electronics are performed in an alternating sequence.

14. The method of claim 9, wherein said step of communicating with the data carrier with the first transceiver electronics and said step of communicating with the data carrier with the second transceiver electronics are performed simultaneously.

15. The method of claim 9, wherein:
    the second resonant circuit of the terminal further has a third capacitor connected at one end to the connection between the antenna and the second capacitor and at a second end to the second terminal so that the third capacitor functions as the connection between the antenna and the second transceiver electronics; and in said step of communicating with the data carrier with the second transceiver electronics, the second transceiver electronics operates so that the second carrier frequency is greater than the first carrier frequency.

16. The method of claim 15, wherein, in said step of communicating with the data carrier with the second transceiver electronics, the second transceiver electronics operates so that the second carrier frequency is at least 10 times greater than the first carrier frequency.

17. The method of claim 15, wherein said step of communicating with the data carrier with the first transceiver electronics and said step of communicating with the data carrier with the second transceiver electronics are performed in an alternating sequence.

18. The method of claim 15, wherein said step of communicating with the data carrier with the first transceiver electronics and said step of communicating with the data carrier with the second transceiver electronics are performed simultaneously.

* * * * *